(12) United States Patent
Ogawa et al.

(10) Patent No.: US 7,186,632 B2
(45) Date of Patent: Mar. 6, 2007

(54) METHOD OF FABRICATING A SEMICONDUCTOR DEVICE HAVING A DECREASED CONCENTRATION OF PHOSPHORUS IMPURITIES IN POLYSILICON

(75) Inventors: Kazuo Ogawa, Tokyo (JP); Kiyonori Ohyu, Tokyo (JP); Kensuke Okonogi, Tokyo (JP); Toshihiro Imamura, Tokyo (JP); Keiichi Watanabe, Tokyo (JP); Hiroyuki Ohta, Tsuchiura (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/395,724

(22) Filed: Mar. 24, 2003

(65) Prior Publication Data
US 2004/0018708 A1    Jan. 29, 2004

(30) Foreign Application Priority Data
Mar. 25, 2002    (JP) ............................. 2002-083540

(51) Int. Cl.
*H01L 21/3205* (2006.01)
*H01L 21/4763* (2006.01)
(52) U.S. Cl. ............... 438/585; 438/592; 438/773; 257/E21.204; 257/E21.621; 257/E21.157
(58) Field of Classification Search ............. 438/585, 438/592, 773
See application file for complete search history.

(56) References Cited

U.S. PATENT DOCUMENTS

| | | | | |
|---|---|---|---|---|
| 5,256,894 A | * | 10/1993 | Shino | ........................ 257/388 |
| 5,620,914 A | | 4/1997 | Hikida et al. | ............... 438/304 |
| 5,688,706 A | * | 11/1997 | Tseng | ........................ 438/289 |
| 5,814,543 A | * | 9/1998 | Nishimoto et al. | ......... 438/264 |
| 6,037,630 A | | 3/2000 | Igarashi et al. | ............. 257/336 |
| 6,046,487 A | * | 4/2000 | Benedict et al. | ............ 257/510 |

(Continued)

FOREIGN PATENT DOCUMENTS

| | | |
|---|---|---|
| JP | 8-116055 | 5/1996 |
| JP | 09-312270 | 12/1997 |

(Continued)

OTHER PUBLICATIONS

"Merrian-Webster OnLine Dicitionary" www.m-w.com, (Feb. 2, 2005).*

(Continued)

*Primary Examiner*—Fernando L. Toledo
(74) *Attorney, Agent, or Firm*—Hayes Soloway P.C.

(57) ABSTRACT

In a method for manufacturing a semiconductor device having a laminated gate electrode, a phosphorus-doped polysilicon is formed on a gate oxide film. A high-melting metal or a compound of a high-melting metal and silicon is formed on the polysilicon. Phosphorus is doped into the polysilicon so that a concentration of the phosphorus in the polysilicon at an interface between the polysilicon and the gate oxide film is $2\times10^{20}(1/cm^3)$ or less. Then, thermal oxidation is carried out in a wet-hydrogen atmosphere containing water vapor.

14 Claims, 4 Drawing Sheets

U.S. PATENT DOCUMENTS

| | | | |
|---|---|---|---|
| 6,245,605 B1 * | 6/2001 | Hwang et al. | 438/216 |
| 6,506,647 B2 * | 1/2003 | Kuroda et al. | 438/275 |
| 6,764,961 B2 * | 7/2004 | Ku et al. | 438/770 |
| 2002/0137321 A1 * | 9/2002 | Ku et al. | 438/592 |
| 2002/0153573 A1 | 10/2002 | Mogami | 257/369 |
| 2003/0071316 A1 * | 4/2003 | Gonzalez et al. | 257/407 |

FOREIGN PATENT DOCUMENTS

| | | |
|---|---|---|
| JP | 9-312270 | 12/1997 |
| JP | 10-326891 | 12/1998 |
| JP | 11-135780 | 5/1999 |
| JP | 2000-243853 | 9/2000 |

OTHER PUBLICATIONS

Wolf and Tauber; "Silicon Processing for the VLSI Era vol. 1: Process Technology", pp. 242-256, Lattice Press, Sunset Beach, CA; 1986.* www.m-w.com/cgi-bin/dictionary?book=Dictionary&va=uniform.*

* cited by examiner

GATE ELECTRODE FORMING PROCESS

WET-HYDROGEN OXIDATION PROCESS

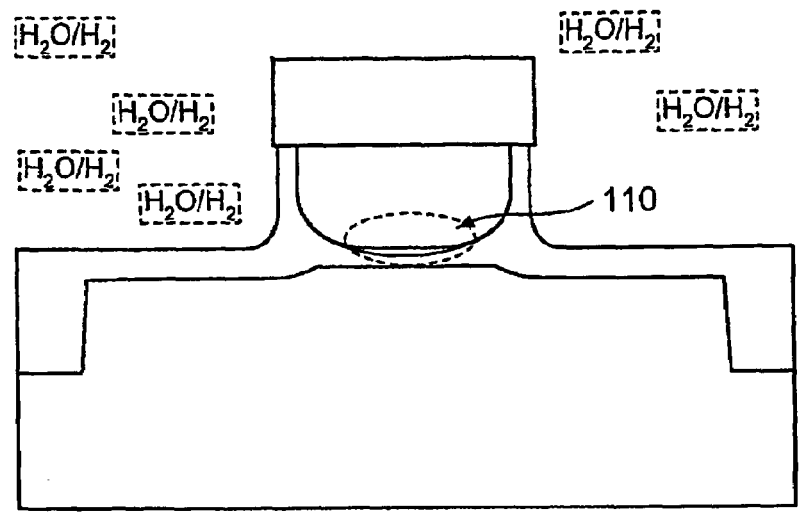
FIG. 4 EXISTING ART
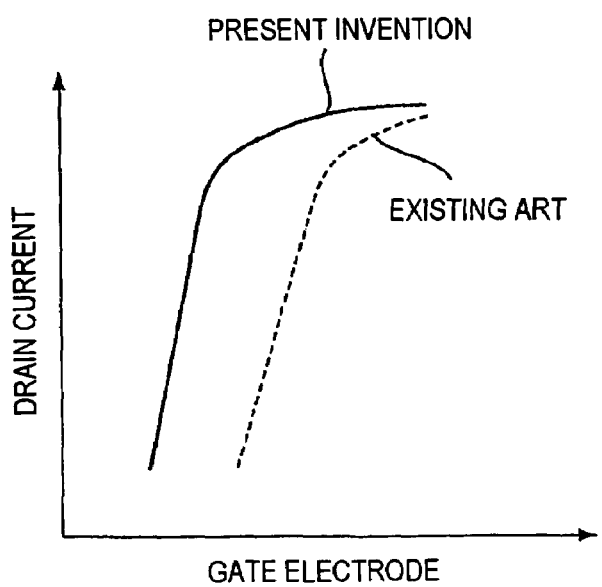
FIG. 5

METHOD OF FABRICATING A SEMICONDUCTOR DEVICE HAVING A DECREASED CONCENTRATION OF PHOSPHORUS IMPURITIES IN POLYSILICON

BACKGROUND OF THE INVENTION

The present invention broadly relates to a method for manufacturing a semiconductor device having a laminated gate electrode.

As a gate electrode of a next-generation MOS transistor, expectation is placed on a tungsten polymetal structure containing tungsten and a polysilicon. A tungsten polymetal gate has extremely low resistance compared with a currently mainstream tungsten polycide gate (laminated structure of a polysilicon and a compound of tungsten and silicon), and has the following advantages in a semiconductor integrated circuit.

The first advantage is miniaturization. In the polycide structure, further miniaturization is difficult due to a problem with resistance values. This is because resistance values increase in inverse proportion to miniaturization in the same structure. By adopting the polymetal structure, it is possible to remove a barrier of the resistance value in miniaturization.

The second advantage is the capability of realizing a high-speed device. As determining factors of a device speed, gate resistance has relatively high ratio. By using a polymetal gate, the delay caused by the gate resistance is minimized.

The present inventors have succeeded in applying a tungsten polymetal gate technology to mass production. However, a fault (or a defect) of peeling-off occurs between a gate polysilicon and a gate oxide film. Generally, adhesion between the polysilicon and the oxide film is extremely high, and such a fault has rarely occurred in the past. In a portion where the peeling-off occurs, a threshold voltage of the MOS transistor is increased which prevents a circuit from operating normally.

As a result of investigation, it has been discovered that a main cause of the fault is a reduction in adhesion strength between the polysilicon and the oxide film caused by wet-hydrogen oxidation. Finally, a bird's beak stress triggered by the wet-hydrogen oxidation causes the peeling-off.

SUMMARY OF THE INVENTION

As a result of investigation conducted by the inventors regarding process dependence of the fault, it has been found that a rate of fault occurrence greatly depends on a concentration of phosphorus in the polysilicon. It has also been found that the adhesion strength between the polysilicon and the oxide film can be greatly improved by reducing the concentration of phosphorus.

It is therefore an object of the present invention to provide a method for manufacturing a semiconductor device which is capable of greatly improving adhesion strength between a polysilicon and an oxide film.

In order to achieve the above-mentioned object, according to an aspect of the present invention, there is provided a method for manufacturing a semiconductor device having a laminated gate electrode comprising:

forming a phosphorus-doped polysilicon on a gate oxide film;

forming a high-melting metal or a compound of a high-melting metal and silicon on the polysilicon;

doping phosphorus into the polysilicon so that a concentration of the phosphorus in the polysilicon at an interface between the polysilicon and the gate oxide film is $2 \times 10^{20}$ ($1/cm^3$) or less; and carrying out thermal oxidation in a wet-hydrogen atmosphere containing water vapor.

Herein, the wet-hydrogen atmosphere is a mixed atmosphere of $H_2O$ and $H_2$. Preferably, the wet-hydrogen atmosphere contains 5 to 10% of water vapor, and the thermal oxidation is carried out under conditions of a temperature of 800 to 900° C. and a film thickness of 3 to 5 nm.

Under such conditions, a bird's beak is formed in a lower end of the polysilicon during the thermal oxidation in the wet-hydrogen atmosphere. This bird's beak is formed so as to reduce a concentration of an electric field in the end of the polysilicon.

Phosphorus is doped at the aforementioned concentration so as to suppress a reduction in adhesion strength between the polysilicon and the gate oxide film caused by a stress of the bird's beak.

Preferably, the concentration of phosphorus in the polysilicon is substantially uniform toward an upper layer of the gate electrode. In this event, the concentration of phosphorus is, for example, $1 \times 10^{20}$($1/cm^3$). Alternatively, the concentration of phosphorus in the polysilicon may be continuously or discontinuously increased toward the upper layer of the gate electrode. Herein, the high-melting metal contains tungsten.

As described above, according to the present invention, in a MOS semiconductor integrated circuit having the laminated gate electrode comprising the high-melting metal as the upper layer, or the compound (namely, silicide) of the high-melting metal and silicon and the phosphorus-doped polysilicon as the lower layer, a concentration of phosphorus in an interface between a polysilicon and a gate oxide film is selected to $2 \times 10^{20}$($1/cm^3$) (i.e., 2E20($1/cm^3$)) or lower. Thereby, a reduction in adhesion strength between the polysilicon and the oxide film in the wet-hydrogen oxidation is suppressed to obtain a high yield. It is to be noted here that the wet-hydrogen oxidation means thermal oxidation carried out in a mixed atmosphere of $H_2O$ and $H_2$.

BRIEF DESCRIPTION OF THE DRAWINGS

FIG. 4 is a view showing a section after wet-hydrogen oxidation by an existing art;

FIG. 5 is a view showing comparison of MOS transistor characteristics between the present invention and the existing art;

DESCRIPTION OF THE PREFERRED EMBODIMENTS

Next, the preferred embodiments of the present invention will be described with reference to the accompanying drawings.

First Embodiment

Now, description will be made of a semiconductor device according to a first embodiment of the present invention.

Figure 1:
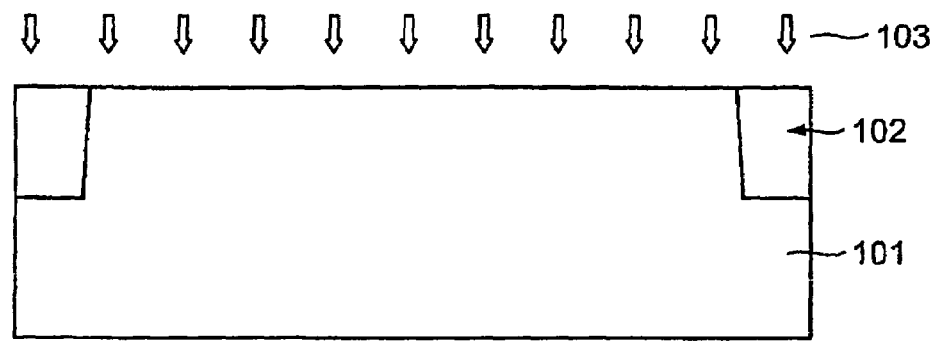
FIG. 1 is a view showing a step for forming device isolation and a well.

Referring to FIG. 1, a device isolation region 102 is formed in a silicon substrate 101. To provide device isolation, a shallow trench isolation (STI) to a depth of about 250 nm is generally used.

Then, impurities 103 are introduced into the silicon substrate 101 so as to form a well by ion implantation. When necessary, another ion implantation may be carried out in order to adjust a threshold of a MOS transistor. Such ion implantations are selectively carried out only in a desired region by photolithography.

Upon completion of such ion implantations, thermal treatment is performed at 900° C. for about 10 min.

Figure 2:
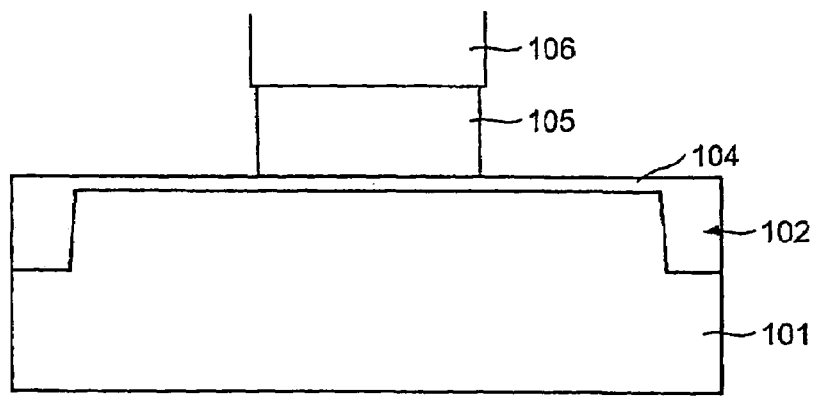
FIG. 2 is a view showing a section after formation of a gate electrode.

Subsequently, a gate electrode is formed. Referring to FIG. 2, a gate oxide film 104 having a thickness of about 7 nm is formed as a gate insulating film by a thermal oxidation method. Then, a phosphorus-doped polysilicon 105 and tungsten 106 are grown respectively by a low-pressure CVD method (LP-CVD method) and a sputtering method. In this case, the phosphorus-doped polysilicon 105 is generally set to a film thickness of about 100 nm, and tungsten 106 to about 80 nm.

Figure 7:
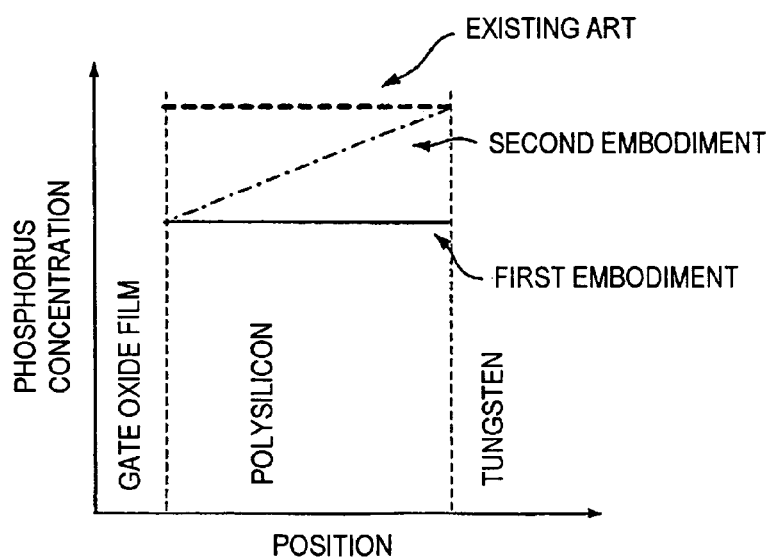
FIG. 7 is a view showing a phosphorus concentration distribution of a phosphorus-doped polysilicon.

A concentration of phosphorus in the phosphorus-doped polysilicon 105 is set at 2E20 (1/cm$^3$) (i.e., $2 \times 10^{20}$(1/cm$^3$)) or lower at an interface between the gate oxide film 104 and the phosphorus-doped polysilicon 105. According to the first embodiment, as shown in FIG. 7, a concentration of phosphorus is set at 1E20 (1/cm$^3$) (i.e., $1 \times 10^{20}$(1/cm$^3$)), with a uniform distribution.

Although not shown in FIG. 2, a barrier metal such as tungsten nitride (WN) may be held between the phosphorus-doped polysilicon 105 and tungsten 106 to secure thermal stability of a device. Additionally, although not shown in FIG. 2, an insulating film may be formed further on an upper layer of tungsten 106.

These films are patterned by a combination of photolithography and anisotropic etching. A gate length is typically set to about 0.10 μm.

Next, the wet-hydrogen oxidation process will be described with reference to FIG. 3.

In this process, thermal oxidation of about 3 to 5 nm is carried out in a wet-hydrogen atmosphere 109 containing water vapor of 5 to 10%. A proper treatment temperature falls with in a range between 800 and 900° C. A wet hydroacid means a mixed atmosphere of H$_2$O and H$_2$. By properly selecting its pressure and temperature, only silicon (including polysilicon) can be oxidized without oxidizing tungsten.

This is a technology using a difference in equilibrium constants of oxidation/reduction reaction between tungsten and silicon, which is also called selective oxidation.

A main purpose of the wet hydroacid is to improve reliability of the device by forming a bird's beak 107. This is because a concentration of an electric field in a gate end can be reduced by the bird's beak 107.

Subsequently, a comparison will be made between the present invention and the existing art. Referring to FIG. 4, a void (cavity) 110 is formed between a gate oxide film 104 and a phosphorus doped polysilicon 105. Presence of such a void 110 increases a threshold voltage of a MOS transistor.

Referring to FIG. 5, comparison is made between characteristic of the MOS transistor of the present invention when the void 110 is not present and characteristic of that of the existing art when the void 110 is present. In FIG. 5, an abscissa indicates a gate voltage while an ordinate indicates a drain current.

Hereinafter, a mechanism of forming the void 110 will be described with reference to FIG. 6. Herein, an abscissa indicates wet-hydrogen oxidation time (or oxide film thickness), while an ordinate indicates adhesion strength between the phosphorus-doped polysilicon and the oxide film.

Figure 6:
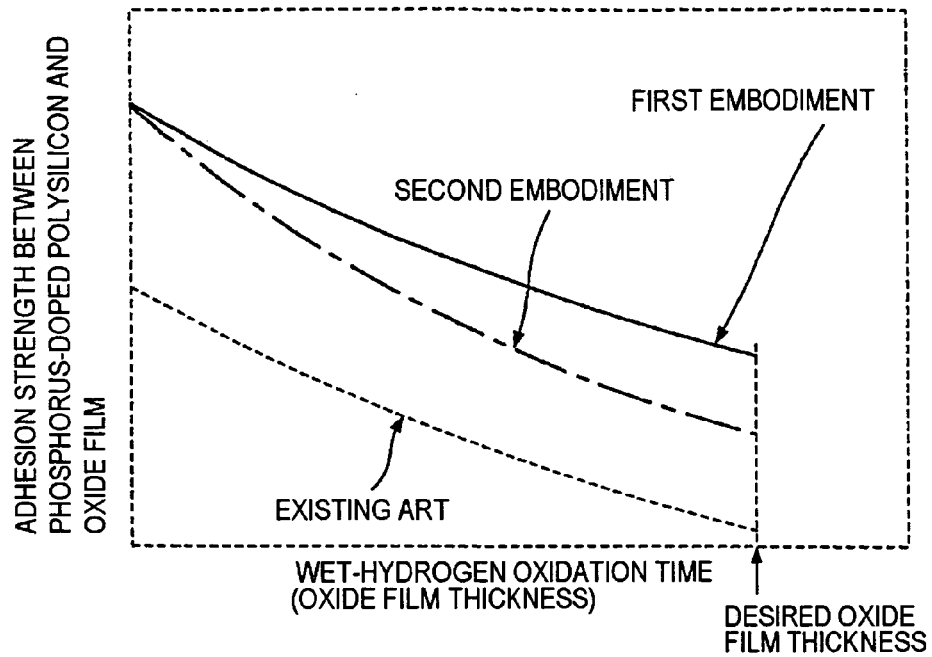
FIG. 6 is a view showing a relation of adhesion strength between a phosphorus-doped polysilicon and an oxide film with wet-hydrogen oxidation.

It can be understood from FIG. 6 that the adhesion strength between the polysilicon and the oxide film is gradually reduced as the wet-hydrogen oxidation progresses. The adhesion strength greatly depends on a concentration of phosphorus in the polysilicon, and the adhesion strength is larger as the concentration of phosphorus is smaller.

In the existing art, a concentration of phosphorus in the phosphorus-doped polysilicon 105 is typically high, i.e., 4E20 (1/cm$^3$). As shown in FIG. 6, as the wet-hydrogen oxidation progresses, adhesive strength between the polysilicon and the oxide film is gradually reduced.

Figure 3:
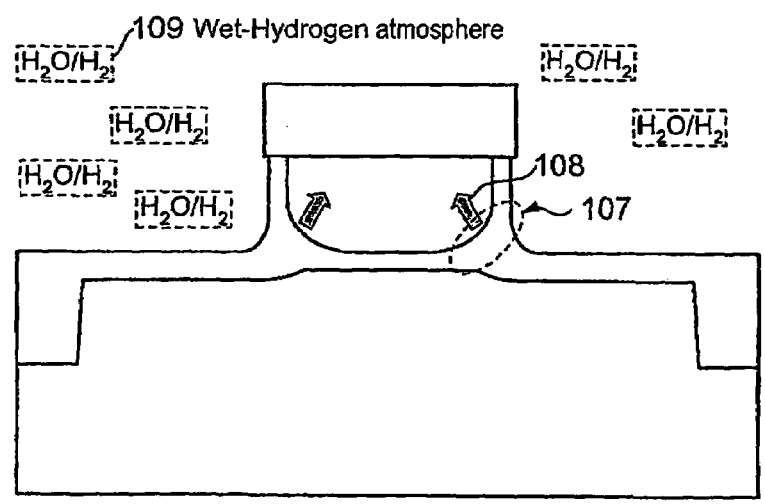
FIG. 3 is a view showing a wet-hydrogen oxidation process.

As shown in FIG. 3, the bird's beak 107 is formed in wet-hydrogen oxidation, as described above. The bird's beak 107 generates a stress 108. Finally, the stress 108 of the bird's beak 107 is applied in a state such that adhesion strength between the phosphorus-doped polysilicon 105 and the gate oxide film 104 is insufficient. Under such a circumstance, peeling-off occurs between the phosphorus-doped polysilicon 105 and the gate oxide film 104 to form the void, as illustrated in FIG. 4.

On the other hand, as shown in FIG. 6, if a concentration of phosphorus is set to 1E20 (1/cm$^3$) according to the first embodiment of the present invention, a reduction in adhesive strength also occurs by wet-hydrogen oxidation, but sufficiently large adhesion strength can still exist compared with the existing art. Thus, no peeling-off occurs between the phosphorus-doped polysilicon 105 and the gate oxide film 104 and thereby a higher yield is obtained.

As described above, description has been made of the laminated gate electrode containing the phosphorus-doped polysilicon 105 and tungsten 106. In practice, however, the upper electrode may be made of an optional high-melting metal or a compound of a high-melting metal and silicon (so-called silicide). This is because it is required to use the wet-hydrogen oxidation according to the present invention.

Second Embodiment

Subsequently, description will be made of a semiconductor device according to a second embodiment of the present invention.

As shown in FIG. 7, in a phosphorus concentration distribution of a phosphorus-doped polysilicon 105, a low concentration is set in an interface side of a gate oxide film 104, and a high concentration is set in an interface side of tungsten 106. Adhesion strength in this case is similar to that shown in FIG. 6.

The high concentration is set in the tungsten 106 side in order to reduce interfacial resistance between the phosphorus-doped polysilicon 105 and tungsten 106. Also in this case, sufficiently large adhesion strength can be obtained compared with the phosphorus concentration of 4E20 (1/cm$^3$) in the polysilicon 105 according to the existing art. The adhesion strength is lower than with a uniform concentration of 1E20 (1/cm$^3$) of the first embodiment. This occurs because the phosphorus is redistributed in wet-hydrogen oxidation in a way which increases the phosphorus concentration in the gate oxide film 104 interface.

The description has been made by way of example where the phosphorus concentration distribution is continuous. Needless to say, however, there are no problems even in the case of a concentration distribution exhibiting stepwise discontinuous changes.

According to the present invention, it is possible to provide the method for manufacturing the semiconductor device, which can greatly improve the adhesion strength between the polysilicon and the oxide film. Specifically, it is possible to obtain the high yield by suppressing the reduction in the adhesion strength between the polysilicon and the oxide film in the wet-hydrogen oxidation process.

While the present invention has thus far been disclosed in conjunction with several embodiments thereof, it will be readily possible for those skilled in the art to put the present invention into practice in various other manners.

What is claimed is:

1. A method for manufacturing a semiconductor device having a laminated gate electrode, comprising:
   forming a phosphorus-doped polysilicon layer on a gate oxide film;
   forming a high-melting metal or a compound of a high-melting metal and silicon on the polysilicon layer;
   doping phosphorus into the polysilicon layer so that a concentration of the phosphorus in the polysilicon layer at an interface between the polysilicon layer and the gate oxide film is $2 \times 10^{20}(1/cm^3)$ or less; and
   carrying out thermal oxidation of about 3 to 5 nm of the polysilicon layer without oxidizing the high-melting metal by treating in a wet-hydrogen atmosphere containing water vapor,
   wherein the wet-hydrogen atmosphere contains 5 to 10% by volume of water vapor, and
   wherein the thermal oxidation is carried out under conditions of a temperature of 800 to 900° C.

2. A method as claimed in claim 1, wherein:
   the wet-hydrogen atmosphere is a mixed atmosphere of $H_2O$ and $H_2$.

3. A method as claimed in claim 1, wherein:
   a bird's beak is formed in a lower end of the polysilicon layer during the thermal oxidation in the wet-hydrogen atmosphere.

4. A method as claimed in claim 3, wherein:
   the bird's beak is formed so as to reduce a concentration of an electric field in the end of the polysilicon layer.

5. A method as claimed in claim 3, wherein:
   the phosphorus is doped so as to suppress a reduction in adhesion strength between the polysilicon layer and the gate oxide film caused by a stress of the bird's beak.

6. A method as claimed in claim 1, wherein:
   the concentration of the phosphorus is equal to $1 \times 10^{20}(1/cm^3)$.

7. A method as claimed in claim 1, wherein:
   the high-melting metal contains tungsten.

8. A method for manufacturing a semiconductor device having a laminated gate electrode, comprising:
   forming a phosphorus-doped polysilicon layer on a gate oxide film;
   forming a layer consisting of a high-melting metal on the polysilicon layer;
   doping phosphorus into the polysilicon layer so that a concentration of the phosphorus in the polysilicon at an interface between the polysilicon layer and the gate oxide film is $2 \times 10^{20}(1/cm^3)$ or less; and
   carrying out thermal oxidation of about 3 to 5 nm of the polysilicon layer without oxidizing the high-melting metal by treating in a wet-hydrogen atmosphere containing water vapor,
   wherein the wet-hydrogen atmosphere contains 5 to 10% by volume of water vapor, and
   wherein the thermal oxidation is carried out under conditions of a temperature of 800 to 900° C.

9. A method as claimed in claim 8, wherein:
   the wet-hydrogen atmosphere is a mixed atmosphere of $H_2O$ and $H_2$.

10. A method as claimed in claim 8, wherein:
    a bird's beak is formed in a lower end of the polysilicon layer during the thermal oxidation in the wet-hydrogen atmosphere.

11. A method as claimed in claim 10, wherein:
    the bird's beak is formed so as to reduce a concentration of an electric field in the end of the polysilicon layer.

12. A method as claimed in claim 10, wherein:
    the phosphorus is doped so as to suppress a reduction in adhesion strength between the polysilicon layer and the gate oxide film caused by a stress of the bird's beak.

13. A method as claimed in claim 8, wherein:
    the concentration of the phosphorus is equal to $1 \times 10^{20}(1/cm^3)$.

14. A method as claimed in claim 8, wherein:
    the high-melting metal contains tungsten.

* * * * *